United States Patent
Shiu et al.

(10) Patent No.: US 6,489,216 B1
(45) Date of Patent: Dec. 3, 2002

(54) CHEMICAL MECHANICAL POLISH (CMP) PLANARIZING METHOD EMPLOYING TOPOGRAPHIC MARK PRESERVATION

(75) Inventors: Ruei-Je Shiu, Tainan; Dian-Hau Chen, Hsinchu, both of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 27 days.

(21) Appl. No.: 09/677,067

(22) Filed: Sep. 29, 2000

(51) Int. Cl.$^7$ ............................... H01L 21/76
(52) U.S. Cl. ................. 438/401; 438/462; 438/626; 438/631; 438/975; 438/692; 257/797
(58) Field of Search .................... 438/401, 626, 438/631, 462, 692, 694, 697, 700, 701, 702, 725, 959, 947, 975; 257/797

(56) References Cited

U.S. PATENT DOCUMENTS

| | | | | |
|---|---|---|---|---|
| 4,067,104 A | * | 1/1978 | Tracy | 29/854 |
| 5,456,756 A | | 10/1995 | Ramaswami et al. | 118/721 |
| 5,705,320 A | * | 1/1998 | Hsu et al. | 430/313 |
| 5,801,090 A | | 9/1998 | Wu et al. | 438/622 |
| 5,911,108 A | * | 6/1999 | Yen | 438/401 |
| 5,998,279 A | * | 12/1999 | Liaw | 438/424 |
| 6,057,206 A | | 5/2000 | Nguyen et al. | 438/401 |
| 6,350,658 B1 | * | 2/2002 | Miraglia | 438/401 |

* cited by examiner

*Primary Examiner*—Carl Whitehead, Jr.
*Assistant Examiner*—Maria Guerrero
(74) *Attorney, Agent, or Firm*—Tung & Associates

(57) ABSTRACT

Within a chemical mechanical polish (CMP) planarizing method for forming a planarized layer there is first provided a microelectronic substrate having a topographic mark formed therein. There is then formed over the microelectronic substrate and covering the topographic mark a blanket conformal layer which forms a replicated topographic mark at the location of the topographic mark. There is then formed over the blanket conformal layer and the replicated topographic mark a patterned negative photoresist layer of areal dimensions minimally sufficient to encapsulate the replicated topographic mark. There is then chemical mechanical polish (CMP) planarized the patterned negative photoresist layer and the blanket conformal layer to form a chemical mechanical polish (CMP) planarized patterned negative photoresist layer and a chemical mechanical polish (CMP) planarized blanket conformal microelectronic layer. Finally, there is then stripped from over the microelectronic substrate the chemical mechanical polish (CMP) planarized patterned negative photoresist layer. By employing the patterned negative photoresist layer of areal dimensions minimally sufficient to encapsulate the alignment mark, the chemical mechanical polish (CMP) planarized blanket conformal microelectronic layer is optimally planarized while preserving the integrity of the alignment mark.

15 Claims, 2 Drawing Sheets

CHEMICAL MECHANICAL POLISH (CMP) PLANARIZING METHOD EMPLOYING TOPOGRAPHIC MARK PRESERVATION

BACKGROUND OF THE INVENTION

1. Field of the Invention

The present invention relates generally to chemical mechanical polish (CMP) planarizing methods employed for forming chemical mechanical polish (CMP) planarized microelectronic layers within microelectronic fabrications. More particularly, the present invention relates to topographic mark preservation methods employed in conjunction with chemical mechanical polish (CMP) planarizing methods employed for forming chemical mechanical polish (CMP) planarized microelectronic layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly important within the art of microelectronic fabrication to form within the art of microelectronic fabrication microelectronic fabrications having formed therein planarized microelectronic layers. Planarized microelectronic layers are desirable in the art of microelectronic fabrication when fabricating microelectronic fabrications insofar as planarized microelectronic layers within microelectronic fabrications provide microelectronic fabrications within which there may more readily be formed with enhanced functionality and enhanced reliability additional microelectronic layers and additional microelectronic structures within the microelectronic fabrications.

While planarized microelectronic layers are thus clearly desirable in the art of microelectronic fabrication, planarized microelectronic layers are nonetheless not formed entirely without problems in the art of microelectronic fabrication.

In that regard, when forming a planarized microelectronic layer within a microelectronic fabrication by planarizing a non-planarized microelectronic layer within the microelectronic fabrication, particularly when planarizing the non-planarized microelectronic layer while employing a chemical mechanical polish (CMP) planarizing method, there is often obliterated or compromised within a microelectronic substrate over which is formed the planarized microelectronic layer while employing the chemical mechanical polish (CMP) planarizing method a topographic mark, such as but not limited to a topographic alignment mark or a topographic identification mark. As is understood by a person skilled in the art, such a topographic alignment mark or a topographic identification mark is typically employed for either aligning or identifying the microelectronic substrate within which is formed the topographic alignment mark or the topographic identification mark. Such obliteration or comprise of the topographic mark, whether a topographic alignment mark or a topographic identification mark, is undesirable in the art of microelectronic fabrication since subsequent alignment or identification of the microelectronic substrate is thus negatively affected when further fabricating the microelectronic fabrication.

It is thus towards the goal of providing a chemical mechanical polish (CMP) planarizing method for forming within a microelectronic fabrication and over a microelectronic substrate having a topographic mark formed therein a chemical mechanical polish (CMP) planarized microelectronic layer while preserving the integrity of the topographic mark formed within the microelectronic substrate over which is formed the chemical mechanical polish (CMP) planarized microelectronic layer that the present invention is directed.

Various methods, materials and apparatus have been disclosed in the art of microelectronic fabrication for preserving the integrity of a topographic mark formed within a microelectronic substrate employed within a microelectronic fabrication when forming over the microelectronic substrate or processing over the microelectronic substrate a microelectronic layer employed within the microelectronic fabrication.

For example, Ramaswami et al., in U.S. Pat. No. 5,456,756, discloses: (1) a microelectronic substrate clamp; (2) a microelectronic conductor metal layer deposition apparatus which employs the microelectronic substrate clamp; and (3) a method for forming over a microelectronic substrate having a topographic mark formed therein a microelectronic conductor metal layer, wherein there is preserved the integrity of the topographic mark formed within the microelectronic substrate when forming over the microelectronic substrate the microelectronic conductor metal layer while employing the method which employs the microelectronic conductor metal layer deposition apparatus which in turn employs the microelectronic substrate clamp. To realize the foregoing object, the microelectronic substrate clamp employs a tab within an interior periphery of the microelectronic substrate clamp, wherein the tab is located in a position such as to occlude deposition of the microelectronic conductor metal layer over a portion of the microelectronic substrate having the topographic mark formed therein when forming while employing the microelectronic substrate clamp, the microelectronic conductor metal layer deposition apparatus and the method the microelectronic conductor metal layer upon the microelectronic substrate when clamped within the microelectronic substrate clamp.

In addition, Wu et al., in U.S. Pat. No. 5,801,090, discloses a method for preserving the integrity of an alignment mark formed within a semiconductor substrate employed within a semiconductor integrated circuit microelectronic fabrication when chemical mechanical polish (CMP) planarizing over the semiconductor substrate employed within the semiconductor integrated circuit microelectronic fabrication at the location of the alignment mark an intermetal dielectric (IMD) layer formed over the semiconductor substrate employed within the semiconductor integrated circuit microelectronic fabrication. In order to realize the foregoing object, the method employs a selective etching of the intermetal dielectric (IMD) layer at the location of the alignment mark both before chemical mechanical polish (CMP) planarizing the intermetal dielectric (IMD) layer and after chemical mechanical polish (CMP) planarizing the intermetal dielectric (IMD) layer.

Finally, Nguyen et al., in U.S. Pat. No. 6,057,206, discloses a method which may be employed for preserving the integrity of an alignment mark formed within a microelectronic substrate employed within a microelectronic fabrication when chemical mechanical polish (CMP) planarizing a microelectronic layer formed over the microelectronic substrate and covering the alignment mark. To realize the foregoing object, the method may employ with respect to a circular microelectronic substrate an annular photoexposed patterned negative photoresist layer formed at a periphery of the circular microelectronic substrate and covering the alignment mark, where the annular photoexposed patterned negative photoresist layer is formed absent a conventional masking method while employing an edge bead photoresist removal tool intended for removing from over the circular substrate an annular edge bead formed of a positive photoresist material.

Desirable in the art of microelectronic fabrication are additional methods and materials which may be employed to preserve the integrity of a topographic mark formed within a microelectronic substrate employed within a microelectronic fabrication when chemical mechanical polish (CMP) planarizing a microelectronic layer formed over the microelectronic substrate employed within the microelectronic fabrication at the location of the topographic mark.

It is towards the foregoing object that the present invention is directed.

SUMMARY OF THE INVENTION

A first object of the present invention is to provide a chemical mechanical polish (CMP) planarizing method for forming within a microelectronic fabrication a chemical mechanical polish (CMP) planarized microelectronic layer over a microelectronic substrate having formed therein a topographic mark.

A second object of the present invention is to provide a chemical mechanical polish (CMP) planarizing method in accord with the first object of the present invention, wherein the integrity of the topographic mark is preserved.

A third object of the present invention is to provide a chemical mechanical polish (CMP) planarizing method in accord with the first object of the present invention and the second object of the present invention, which chemical mechanical polish (CMP) planarizing method is readily commercially implemented.

In accord with the objects of the present invention, there is provided a chemical mechanical polish (CMP) planarizing method for forming a planarized microelectronic layer within a microelectronic fabrication. To practice the method of the present invention, there is first provided a microelectronic substrate, where the microelectronic substrate has a minimum of one topographic mark formed therein. There is then formed over the microelectronic substrate and covering the minimum of one topographic mark a blanket conformal layer which forms a minimum of one replicated topographic mark at the location of the minimum of one topographic mark. There is then formed over the blanket conformal layer and the minimum of one replicated topographic mark a minimum of one patterned negative photoresist layer of areal dimensions minimally sufficient to encapsulate the minimum of one replicated topographic mark. There is then chemical mechanical polish (CMP) planarized the minimum of one patterned negative photoresist layer and the blanket conformal layer to form a minimum of one chemical mechanical polish (CMP) planarized patterned negative photoresist layer and a chemical mechanical polish (CMP) planarized blanket conformal microelectronic layer. Finally, there is then stripped from over the microelectronic substrate the minimum of one chemical mechanical polish (CMP) planarized patterned negative photoresist layer.

There is provided by the present invention a chemical mechanical polish (CMP) planarizing method for forming within a microelectronic fabrication a chemical mechanical polish (CMP) planarized microelectronic layer over a substrate having formed therein a topographic mark, wherein the integrity of the topographic mark is preserved. The present invention realizes the foregoing object by employing when chemical mechanical polish (CMP) planarizing a blanket conformal layer formed over a substrate having formed therein a minimum of one topographic mark, and wherein the blanket conformal layer has formed therein a minimum of one replicated topographic mark at the location of the minimum of one topographic mark, a minimum of one patterned negative photoresist layer of areal dimensions minimally sufficient to encapsulate the minimum of one replicated topographic mark.

The method of the present invention is readily commercially implemented. As will be illustrated within the context of the Description of the Preferred Embodiment which follows, the present invention employs methods, materials and apparatus as are generally known in the art of microelectronic fabrication, but employed within the context of a specific configuration and ordering to provide the present invention. Since it is thus a novel ordering and use of methods, materials and apparatus which provides the present invention, rather than the existence of methods, materials and apparatus which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

There is provided by the present invention a chemical mechanical polish (CMP) planarizing method for forming within a microelectronic fabrication a chemical mechanical polish (CMP) planarized layer over a substrate having formed therein a topographic mark, wherein the integrity of the topographic mark is preserved. The present invention realizes the foregoing object by employing when chemical mechanical polish (CMP) planarizing a blanket conformal layer formed over a substrate having formed therein a minimum of one topographic mark, and wherein the blanket conformal layer has formed therein a minimum of one replicated topographic mark at the location of the minimum of one topographic mark, a patterned negative photoresist layer of areal dimensions minimally sufficient to encapsulate the minimum of one replicated topographic mark.

While the preferred embodiment of the present invention illustrates the present invention within the specific context of preserving the integrity of an alignment mark within a microelectronic substrate when chemical mechanical polish (CMP) planarizing over the microelectronic substrate a blanket conformal microelectronic layer, the present invention is generally applicable to preserving when chemical mechanical polish (CMP) planarizing a blanket microelectronic layer formed over a microelectronic substrate the integrity of a topographic mark within the microelectronic substrate, wherein the topographic mark is selected from the group including but not limited to topographic alignment marks and topographic identification marks.

Referring now to FIG. 1 to FIG. 7, there is shown a series of schematic cross-sectional and schematic plan-view diagrams illustrating the results of progressive stages in forming within a microelectronic fabrication, and in accord with a preferred embodiment of the present invention, a chemical mechanical polish (CMP) planarized microelectronic layer within the microelectronic fabrication.

Figure 1:
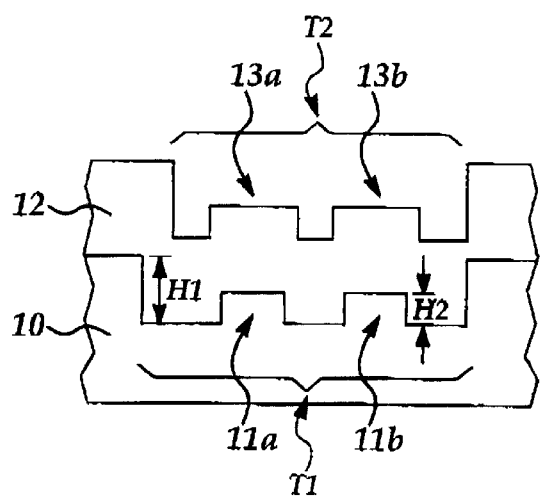
FIG. 1, FIG. 2, FIG. 3, FIG. 4, FIG. 5, FIG. 6 and FIG. 7 show a series of schematic cross-sectional and schematic plan-view diagrams illustrating the results of forming, in accord with a preferred embodiment of the present invention, a chemical mechanical polish (CMP) planarized microelectronic layer within a microelectronic fabrication.

Shown in FIG. 1 is a schematic cross-sectional diagram of the microelectronic fabrication at an early stage in its fabrication in accord with the preferred embodiment of the present invention.

Shown in FIG. 1 in a first instance is a substrate 10 having formed therein a pair of alignment marks 11a and 11b.

Within the preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, although not specifically illustrated within the schematic cross-sectional diagram of FIG. 1, the substrate 10 may consist of a substrate alone as employed within the microelectronic fabrication, or in an alternative, the substrate 10 may comprise the substrate as employed within the microelectronic fabrication, where the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

Similarly, and also not specifically illustrated within the schematic cross-sectional diagram of FIG. 1, the substrate 10, typically and preferably, but not exclusively, when the substrate 10 consists of or comprises a semiconductor substrate employed within a semiconductor integrated circuit microelectronic fabrication, has formed therein and or thereupon microelectronic devices as are conventional within the microelectronic fabrication within which is employed the substrate 10. Such microelectronic devices may include, but are not limited to resistors, transistors, diodes and capacitors.

Most typically and preferably, but also not exclusively, within the preferred embodiment of the present invention the substrate 10 consists of or comprises a semiconductor substrate employed within a semiconductor integrated circuit microelectronic fabrication, and the semiconductor substrate has formed therein and/or thereupon semiconductor microelectronic devices.

Within the preferred embodiment of the present invention with respect to the pair of alignment marks 11a and 11b, the pair of alignment marks 11a and 11b is, as is illustrated within the schematic cross-sectional diagram of FIG. 1, typically and preferably, but not exclusively, formed within a trough T1 within the substrate 10, wherein the trough T1 has a depth H1 within the substrate 10 of from about 3000 to about 6000 angstroms, as well as a bidirectional linewidth (not completely illustrated) within the substrate 10 of from about 300 to about 500 microns. Similarly, and as is also in part illustrated within the schematic cross-sectional diagram of FIG. 1 with respect to each of the individual alignment marks 11a and 11b, each of the individual alignment marks 11a and 11b typically and preferably has a height H2 of from about 1000 to about 1400 angstroms to thus be completely vertically contained within the trough T1 within the substrate 10. Finally, although not completely illustrated within the schematic cross-sectional diagram of FIG. 1, each of the individual alignment marks 11a and 11b has a bidirectional linewidth of from about 8 to about 10 microns and thus both of the individual alignment marks 11a and 11b are horizontally and laterally contained within the trough T1.

As is understood by a person skilled in the art, within the context of the present invention and the preferred embodiment of the present invention the alignment marks 11a and 11b may be formed employing any of several geometric shapes, including but not limited to circles, squares, rectangles, crosses and the like.

Shown also within the schematic cross-sectional diagram of FIG. 1 is a blanket conformal first microelectronic layer 12 formed covering the substrate 10 including the pair of alignment marks 11a and 11b. As is illustrated within the schematic cross-sectional diagram of FIG. 1, the blanket conformal first microelectronic layer 12 has formed therein at a location corresponding with the pair of alignment marks 11a and 11b within the substrate 10 a pair of once replicated alignment marks 13a and 13b. As is similarly also illustrated within the schematic cross-sectional diagram of FIG. 1 the blanket conformal first microelectronic layer 12 also has formed therein at the location of the trough T1 within the substrate 10 a once replicated trough T2. As is understood by a person skilled in the art, insofar as the blanket conformal first microelectronic layer 12 is formed conformally and of nominally equivalent thickness at all locations, the pair of once replicated alignment marks 13a and 13b will typically and preferably have a greater bidirectional linewidth than the pair of alignment marks 11a and 11b and the once replicated trough T2 will typically and preferably have a smaller bidirectional linewidth than the trough T1.

Within the preferred embodiment of the present invention with respect to the blanket conformal first microelectronic layer 12, the blanket conformal first microelectronic layer 12 may be formed employing methods and materials as are conventional in the art of microelectronic fabrication, including but not limited to chemical vapor deposition (CVD) methods, plasma enhanced chemical vapor deposition (PECVD) methods and physical vapor deposition (PVD) methods which provide the blanket conformal first microelectronic layer 12 formed of microelectronic materials including but not limited to microelectronic conductor materials, microelectronic semiconductor materials and microelectronic dielectric materials. Typically and preferably, although not exclusively, the blanket conformal first microelectronic layer 12 is formed to a thickness somewhat deeper than the depth of the trough T1, typically and preferably from about 10000 to about 15000 angstroms, to form the blanket conformal first microelectronic layer 12 having formed therein the once replicated trough T2 in turn having formed therein the pair of once replicated alignment marks 13a and 13b.

Figure 2:
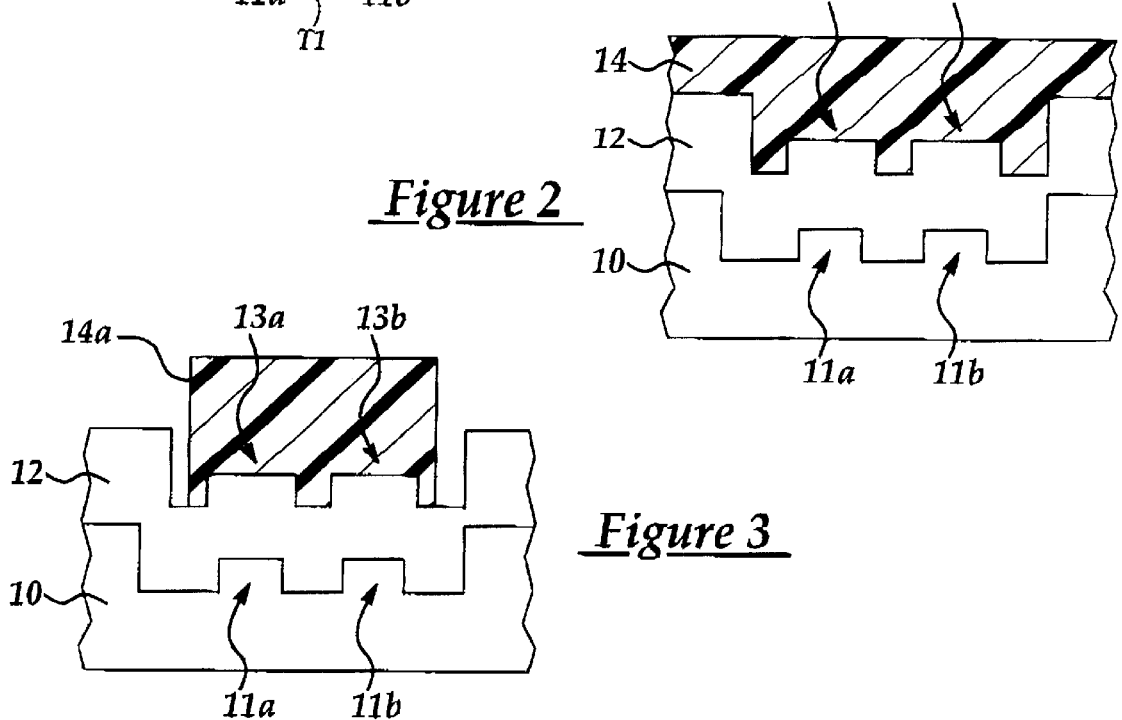

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed upon the blanket conformal first microelectronic layer 12 a blanket negative log photoresist layer 14. The blanket negative photoresist layer 14 may be formed from any of several negative photoresist material as are conventional in the art of microelectronic fabrication, provided that the negative photoresist material may be exposed and developed to form a patterned photoresist layer with sufficient resolution to adequately perform within the context of the present invention. Typically and preferably, the blanket negative photoresist layer 14 is formed to a planarizing thickness of from about 30000 to about 50000 angstroms.

Figure 3:
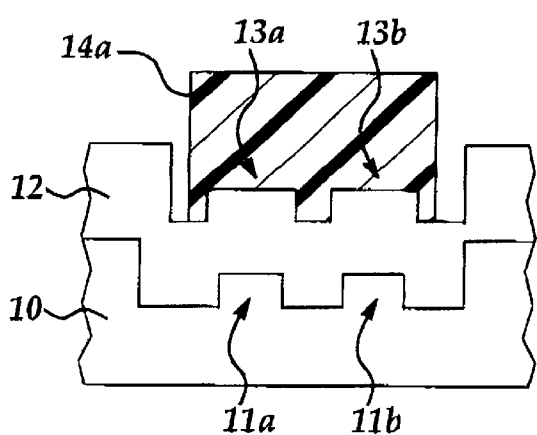

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein the blanket negative photoresist layer 14 has been patterned to form a patterned negative photoresist layer 14a. Although the blanket negative photoresist layer 14 as illustrated within the schematic cross-sectional diagram of FIG. 2 may be patterned to form the patterned negative photoresist layer 14a as illustrated within the schematic cross-sectional diagram of FIG. 3 while employing reticle based optical photolithographic exposure and development methods as are otherwise generally conventional in the art of microelectronic fabrication, within the context of the present invention and the preferred embodiment of the present invention, the blanket negative photoresist layer 14 as illustrated within the schematic cross-sectional diagram of FIG. 2 is typically and preferably photoexposed and developed to form the patterned negative photoresist layer 14a as illustrated within the schematic cross-sectional diagram of FIG. 3 while employing an edge bead photoresist exposure and development tool as is otherwise generally known in the art of microelectronic fabrication and employed for removing from microelectronic substrates photoresist edge beads formed of positive photoresist materials.

The use of such an edge bead photoresist exposure and development tool with respect to an application analogous to the present invention is disclosed in greater detail within Nguyen et al., in U.S. Pat. No. 6,057,206, as cited within the Description of the Related Art, the teachings of all of which related art are incorporated herein fully by reference. As is further understood by a person skilled in the art, in contrast with that which is disclosed within Nguyen et al., and as will be illustrated in greater detail in conjunction with the schematic plan-view diagram of FIG. 4, within the present invention, the patterned negative photoresist layer 14a is formed of areal dimensions minimally sufficient to fully encapsulate the pair of once replicated alignment marks 13a and 13b. Within the context of the present invention and the preferred embodiment of the present invention such "minimally sufficient" areal dimensions will typically and preferably provide an encapsulating thickness of the patterned negative photoresist layer 14a of from about 30000 to about 50000 microns adjoining an outer edge of each of the once replicated alignment marks 13a and 13b.

Such "minimally sufficient" areal dimensions of the patterned negative photoresist layer 14a may be effected by fabricating and using an appropriate shutter disk within the edge bead photoresist exposure and development tool as disclosed within Nguyen et al. Typically and preferably the appropriate shutter disk will have multiple apertures corresponding with multiple separated locations of alignment marks on a substrate, such as the substrate 10.

Figure 4:
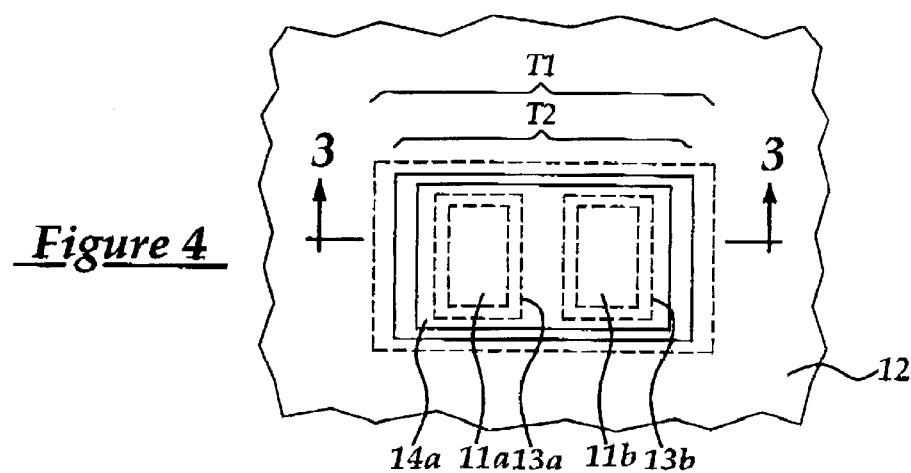

Referring now to FIG. 4, there is shown a schematic plan-view diagram of a microelectronic fabrication corresponding with the microelectronic fabrication whose schematic cross-sectional diagram is illustrated in FIG. 3.

As is shown in the schematic plan-view diagram of FIG. 4, the patterned photoresist layer 14a is formed of minimally sufficient bidirectional areal dimensions to completely encapsulate the pair of once replicated alignment marks 13a and 13b, while similarly also preferably being contained within the once replicated trough T2 within the blanket conformal first microelectronic layer 12. Also illustrated within the schematic plan-view diagram of FIG. 4 is the pair of alignment marks 11a and 11b, as well as the trough T1.

Figure 5:
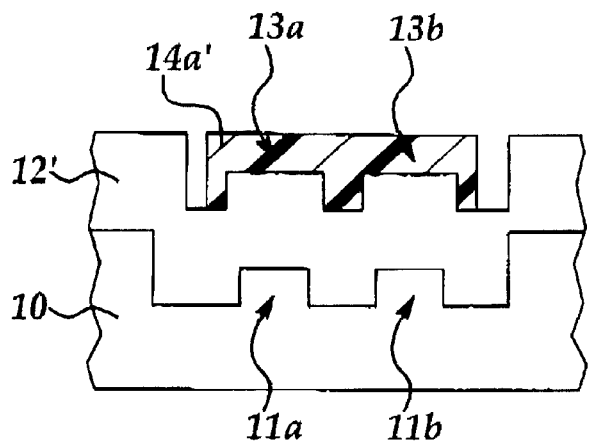

Referring now to FIG. 5, there is shown a schematic cross-sectional diagram illustrating the results of further processing of the microelectronic fabrication whose schematic cross-sectional diagram is illustrated in FIG. 3 and whose schematic plan-view diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 3 and whose schematic plan-view diagram is 5 illustrated in FIG. 4, but wherein the patterned negative photoresist layer 14a has been chemical mechanical polish (CMP) planarized to form a chemical mechanical polish (CMP) planarized patterned negative photoresist layer 14a' and the blanket conformal first microelectronic layer 12 has simultaneously been chemical to mechanical polish (CMP) planarized to form a chemical mechanical polish (CMP) planarized blanket conformal first microelectronic layer 12'.

Within the preferred embodiment of the present invention, the patterned negative photoresist layer 14a may be chemical mechanical polish (CMP) planarized to form the chemical mechanical polish (CMP) planarized patterned negative photoresist layer 14a' and the blanket conformal first microelectronic layer 12 may be simultaneously chemical mechanical polish (CMP) planarized to form the chemical mechanical polish (CMP) planarized blanket conformal first microelectronic layer 12' while employing a chemical mechanical polish (CMP) slurry composition and a chemical mechanical polish (CMP) planarizing apparatus as are optimized to optimally planarize the chemical mechanical polish (CMP) planarized blanket conformal first microelectronic layer 12' while not completely planarizing the chemical mechanical polish (CMP) planarized patterned negative photoresist layer 14a' from over the once replicated alignment marks 13a and 13b. Typically and preferably, in order to effect such optimization there will need to be considered the characteristics of a negative photoresist material from which is formed the patterned negative photoresist layer 14a (as photoexposed) in conjunction with a microelectronic material from which is formed the blanket conformal first microelectronic layer 12.

As is similarly understood by a person skilled in the art, and as is noted above, by forming the patterned negative photoresist layer 14a of minimally sufficient dimensions to encapsulated the pair of once replicated alignment marks 13a and 13b, while similarly containing the patterned negative photoresist layer 14a within the once replicated trough T2 as illustrated within the microelectronic fabrication whose schematic plan-view diagram is illustrated in FIG. 4, there is also in-part effected such optimization of planarization of the chemical mechanical polish (CMP) planarized blanket conformal first microelectronic layer 12'.

Figure 6:
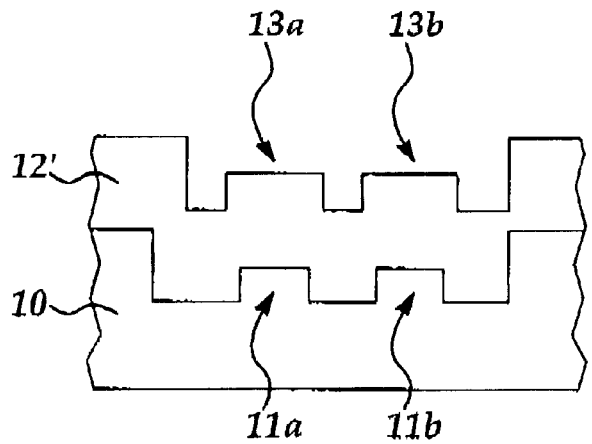

Referring now to FIG. 6, there is shown a schematic cross-sectional diagram illustrating the results of further processing of the microelectronic fabrication whose schematic cross-sectional diagram is illustrated in FIG. 5.

Shown in FIG. 6 is a schematic cross-sectional diagram of a microelectronic fabrication otherwise equivalent to the microelectronic fabrication whose schematic cross-sectional diagram is illustrated in FIG. 5, but wherein the chemical mechanical polish (CMP) planarized patterned negative photoresist layer 14a' has been stripped from over the chemical mechanical polish (CMP) planarized blanket conformal first microelectronic layer 12' at the location of the once replicated alignment marks 13a and 13b. The chemical mechanical polish (CMP) planarized patterned negative photoresist layer 14a' may be stripped from over the chemical mechanical polish (CMP) planarized blanket conformal first microelectronic layer 12' at the location of the once replicated alignment marks 13a and 13b while employing photoresist stripping methods and materials as are conventional in the art of microelectronic fabrication, such photoresist stripping methods and materials including but not limited to dry plasma photoresist stripping methods and materials and wet chemical photoresist stripping methods and materials.

Figure 7:
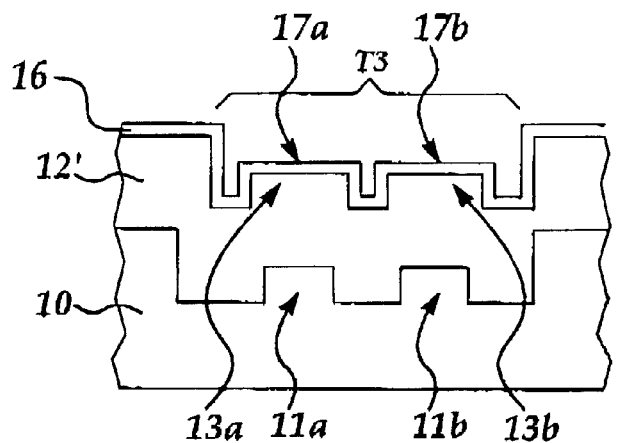

Referring now to FIG. 7, there is shown a schematic cross-sectional diagram illustrating the results of further processing of the microelectronic fabrication whose schematic cross-sectional diagram is illustrated in FIG. 6. Shown in FIG. 7 is a schematic cross-sectional diagram of a microelectronic fabrication otherwise equivalent to the microelectronic fabrication whose schematic cross-sectional diagram is illustrated in FIG. 6, but wherein there is formed upon the chemical mechanical polish (CMP) planarized blanket conformal first microelectronic layer 12' a blanket conformal second microelectronic layer 16 which forms a pair of twice replicated alignment marks 17a and 17b within a twice replicated trough T3 at the location of the once replicated alignment marks 13a and 13b within the once replicated trough T2. As is understood by a person skilled in the art, the blanket conformal second microelectronic layer 16 as illustrated within the schematic cross-sectional diagram of FIG. 7 may be formed employing methods, materials and dimensions analogous or equivalent to the methods, materials and dimensions as are employed for forming the blanket conformal first microelectronic layer 12 as illustrated within the schematic cross-sectional diagram of FIG. 1. Similarly, as is also understood by a person skilled in the art, the microelectronic fabrication whose schematic cross-sectional diagram is illustrated in FIG. 7 may be further processed in accord with the microelectronic fabrications whose schematic cross-sectional and schematic plan-view diagrams are illustrated in FIG. 2 to FIG. 6 to provide a chemical mechanical polish (CMP) planarized blanket conformal second dielectric layer while preserving the integrity of the pair of twice replicated alignment marks 17a and 17b within the twice replicated trough T3.

As is understood by a person skilled in the art, the preferred embodiment of the present invention is illustrative of the present invention rather than limiting of the present invention. Revisions and modifications may be made to methods, materials, structures and dimensions through which is provided a microelectronic fabrication in accord with the preferred embodiment of the present invention, while still providing a microelectronic fabrication in accord with the present invention, further in accord with the appended claims.

What is claimed is:

1. A chemical mechanical polish (CMP) planarizing method for forming a planarized layer comprising:

providing a microelectronic substrate, the microelectronic substrate having a minimum of one topographic mark formed therein;

forming over the microelectronic substrate and covering the minimum of one topographic mark a blanket conformal layer which forms a minimum of one replicated topographic mark at the location of the minimum of one topographic mark;

forming over the blanket conformal layer and the minimum of one replicated topographic mark a minimum of one patterned negative photoresist layer of areal dimensions minimally sufficient to encapsulate the minimum of one replicated topographic mark;

chemical mechanical polish (CMP) planarizing the minimum of one patterned negative photoresist layer and the blanket conformal layer to form a minimum of one chemical mechanical polish (CMP) planarized patterned negative photoresist layer and a chemical mechanical polish (CMP) planarized blanket conformal layer; and stripping from over the microelectronic substrate the minimum of one chemical mechanical polish (CMP) planarized patterned negative photoresist layer.

2. The method of claim 1 wherein by employing the minimum of one patterned negative photoresist layer of areal dimensions minimally sufficient to encapsulate the minimum of one replicated alignment mark, the chemical mechanical polish (CMP) planarized blanket conformal layer is optimally planarized while preserving the integrity of the minimum of one alignment mark.

3. The method of claim 1 wherein the microelectronic substrate is employed within a microelectronic fabrication selected from the group consisting of an integrated circuit microelectronic fabrication, a ceramic substrate microelectronic fabrication, a solar cell optoelectronic microelectronic fabrication, a sensor image array optoelectronic microelectronic fabrication and a display image array optoelectronic microelectronic fabrication.

4. The method of claim 1 wherein the minimum of one topographic mark is selected from the group consisting of topographic alignment marks and topographic identification marks.

5. The method of claim 1 wherein the blanket conformal layer is formed from a microelectronic material selected from the group consisting of microelectronic conductor materials, microelectronic semiconductor materials and microelectronic dielectric materials.

6. The method of claim 1 wherein the minimum of one patterned negative photoresist layer is formed employing an edge bead photoexposure and development tool intended for use in removing from a substrate an edge bead of a photoresist layer formed of a positive photoresist material.

7. The method of claim 1 wherein:

the minimum of one topographic mark is formed within a minimum of one trough within the substrate;

the minimum of one replicated topographic mark is formed within a minimum of one replicated trough within the blanket conformal layer.

8. The method of claim 7 wherein the minimum of one patterned negative photoresist layer is also formed within the minimum of one replicated trough within the blanket conformal layer.

9. A chemical mechanical polish (CMP) planarizing method for forming a planarized layer comprising:

providing a semiconductor substrate, the semiconductor substrate having a minimum of one topographic mark formed therein;

forming over the semiconductor substrate and covering the minimum of one topographic mark a blanket conformal layer which forms a minimum of one replicated topographic mark at the location of the minimum of one topographic mark;

forming over the blanket conformal layer and the minimum of one replicated topographic mark a minimum of one patterned negative photoresist layer of areal dimensions minimally sufficient to encapsulate the minimum of one replicated topographic mark;

chemical mechanical polish (CMP) planarizing the minimum of one patterned negative photoresist layer and the blanket conformal layer to form a minimum of one chemical mechanical polish (CMP) planarized patterned negative photoresist layer and a chemical mechanical polish (CMP) planarized blanket conformal layer; and stripping from over the semiconductor substrate the minimum of one chemical mechanical polish (CMP) planarized patterned negative photoresist layer.

10. The method of claim 9 wherein by employing the minimum of one patterned negative photoresist layer of areal dimensions minimally sufficient to encapsulate the minimum of one replicated alignment mark, the chemical mechanical polish (CMP) planarized blanket conformal layer is optimally planarized while preserving the integrity of the minimum of one alignment mark.

11. The method of claim 9 wherein the minimum of one topographic mark is selected from the group consisting of topographic alignment marks and topographic identification marks.

12. The method of claim 9 wherein the blanket conformal layer is formed from a microelectronic material selected from the group consisting of microelectronic conductor materials, microelectronic semiconductor materials and microelectronic dielectric materials.

13. The method of claim 9 wherein the minimum of one patterned negative photoresist layer is formed employing an edge bead photoexposure and development tool intended for use in removing from a substrate an edge bead of a photoresist layer formed of a positive photoresist material.

14. The method of claim 9 wherein:
the minimum of one topographic mark is formed within a minimum of one trough within the semiconductor substrate;
the minimum of one replicated alignment mark is formed within a minimum of one replicated trough within the blanket conformal layer.

15. The method of claim 14 wherein the minimum of one patterned negative photoresist layer is also formed within the minimum of one replicated trough within the blanket conformal layer.

* * * * *